United States Patent [19]

Goronkin et al.

[11] Patent Number: 5,326,985
[45] Date of Patent: * Jul. 5, 1994

[54] BIPOLAR DOPED SEMICONDUCTOR STRUCTURE AND METHOD FOR MAKING

[75] Inventors: Herbert Goronkin, Tempe; Jun Shen, Phoenix; Saied N. Tehrani, Scottsdale, all of Ariz.

[73] Assignee: Motorola, Inc., Schaumburg, Ill.

[*] Notice: The portion of the term of this patent subsequent to Mar. 29, 2011 has been disclaimed.

[21] Appl. No.: 951,994

[22] Filed: Sep. 28, 1992

[51] Int. Cl.$^5$ .................. H01L 29/161; H01L 29/205
[52] U.S. Cl. ..................................... 257/22; 257/21; 257/25; 257/197; 257/201
[58] Field of Search .................. 257/22, 21, 25, 197, 257/201

[56] References Cited

U.S. PATENT DOCUMENTS

| 4,326,208 | 4/1982 | Fang et al. | 257/201 |
| 4,538,165 | 8/1985 | Chang et al. | 257/201 |
| 4,743,951 | 5/1988 | Chang et al. | 357/22 |
| 5,031,005 | 7/1991 | Futatsugi et al. | 257/197 |
| 5,079,601 | 1/1992 | Esaki et al. | 257/22 |
| 5,113,231 | 5/1992 | Söderström et al. | 257/197 |
| 5,124,771 | 6/1992 | Taira et al. | 257/197 |

FOREIGN PATENT DOCUMENTS 62-45064  2/1987  Japan ..................... 257/22

OTHER PUBLICATIONS

Capasso et al., "New Avalanche Multiplication Phenomenon in Quantum Well Superlattices: . . . ", Appl. Phys. Lett., vol. 48, #19, May 12, 1986, pp. 1294–1296.
Söderström et al., "InAs/AlSb Double-Barrier Structure with Large Peak to Valley Current Ratio", IEEE Electron Device Letters, vol. 11, #1, Jan. 1990, pp. 27–29.
Peter C. Sercel et al, "Type II broken-gap quantum wires and quantum dot arrays: A novel concept for self-doping semiconductor nanostructures" (Oct. 8, 1990).
R. Beresford et al, "Interband Tunneling in Single-barrier InAs/AlSb/GaSb Heterostructures" (Mar. 5, 1990).
X. Zhu et al, "Excitonic Insulator Transition in a GaSb-AlSb-InAs Quantum Well Structure" (1990).

Primary Examiner—Rolf Hille
Assistant Examiner—Mahshid Saadat
Attorney, Agent, or Firm—Aaron Bernstein; Joe E. Barbee

[57] ABSTRACT

A semiconductor structure that provides both N-type and P-type doping from a single dopant source is provided. A first doping region (13) comprising a first material composition includes holes and electrons in a doping energy level ($E_D$). A first undoped spacer region (12) comprising the first material composition covers the doping region (13). An undoped channel (11,14) comprising a second material composition covers the first spacer region (12) and a second undoped spacer region (12) comprising the first material composition covers the undoped channel (11,14). The first material composition has a wider bandgap than the second material composition and the doping energy level ($E_D$) is selected to provide electrons to the undoped channel (11,14) when the second material composition has a conduction band minimum less than the doping energy level ($E_D$) and to provide holes to the first undoped channel (11,14) when the second material composition has a valence band maximum greater than the doping energy level ($E_D$).

13 Claims, 1 Drawing Sheet

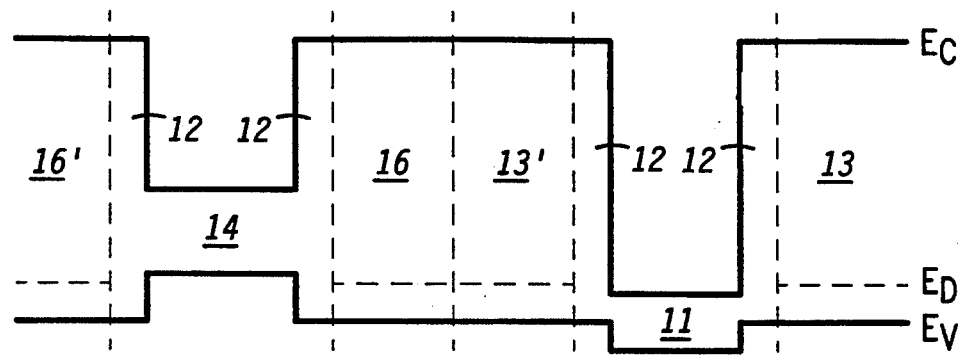
FIG. 1
FIG. 2
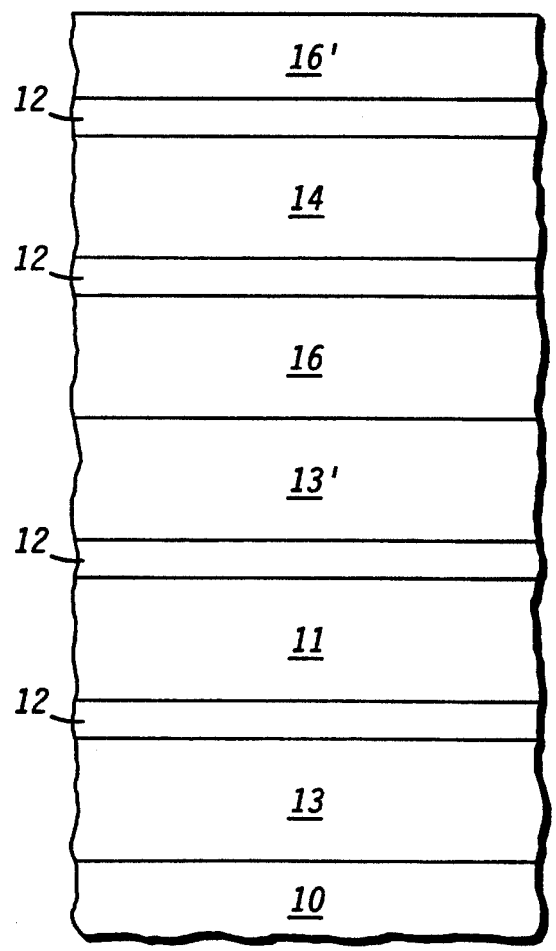

BIPOLAR DOPED SEMICONDUCTOR STRUCTURE AND METHOD FOR MAKING

BACKGROUND OF THE INVENTION

The present invention relates, in general, to semiconductor devices and, more particularly, to quantum well semiconductor structures having a single source for both n-type and p-type doping.

Traditional semiconductor devices are formed on a semiconductor substrate. Intrinsic semiconductor material is very high resistivity or semi-insulating. Conventionally, the resistivity of semiconductor material is lowered by doping portions of the semiconductor material with atoms that provide excess electrons and holes. For example boron is a P-type dopant in silicon, while phosphorous and arsenic are N-type dopants. This type of doping is called extrinsic doping.

One problem with extrinsic doping is that the dopant atoms increase scattering of charge carriers moving in the semiconductor material. Increased scattering is reflected in lower mobility in the semiconductor material. Moreover, lower mobility results in devices with slower switching and higher power consumption. This problem is addressed to some degree by modulation doping in heterostructure semiconductor devices. Modulation doping physically separates the dopant atoms from the excess charge carriers that they provide using quantum wells and barriers.

Another problem with conventional extrinsic as well as modulation doping is that one kind of atom is required for N-type doping and another kind of atom is required for P-type doping. To manufacture bipolar devices, which are devices having both N-type and P-type regions, both kinds of doping atoms must be supplied. This increases capital requirements for manufacturers and complicates processing. Because many of the dopant atoms used in semiconductor processing are toxic, manufacturing safety is directly affected by the number of chemicals and dopants required to produce a device.

What is needed is a semiconductor structure that provides both N-type and P-type doping from a single dopant source and that is compatible with modulation doping techniques.

SUMMARY OF THE INVENTION

Briefly stated, the advantages of the present invention are achieved by a semiconductor structure that provides bipolar doping-both N-type and P-type—from a single dopant source. A first doping region substantially comprising a first material composition covers an upper surface of a substrate. The first doping region includes holes and electrons in a doping energy level. A first undoped spacer region comprising the first material composition covers the doping region. A first undoped channel comprising a second material composition covers the first spacer region and a second undoped spacer region comprising the first material composition covers the first undoped channel. The first material composition has a wider bandgap than the second material composition and the doping energy level is selected to provide electrons to the first undoped channel when the second material composition has a conduction band energy less than the doping energy level and to provide holes to the first undoped channel when the second material composition has a valence band energy greater than the doping energy level.

In a method for bipolar doping of a semiconductor, a doping layer comprising a first material composition having doping atoms with a doping energy level is formed on a semiconductor substrate. A substantially undoped first spacer layer comprising the first material composition is formed on the doping layer. A first substantially undoped channel region comprising a second material composition is formed covering the first spacer layer. The channel region is P-type when the valence band maximum is above the doping energy level, and is N-type when the conduction band minimum is below the doping energy level. A substantially undoped second spacer layer comprising the first material composition is formed covering the wider bandgap than the second material composition.

BRIEF DESCRIPTION OF THE DRAWINGS

FIG. 1 illustrates a band diagram of a portion of a semiconductor device having bipolar doping in accordance with the present invention; and FIG. 2 illustrates a cross-sectional view of a portion of a semiconductor device having bipolar doping in accordance with the present invention.

DETAILED DESCRIPTION OF THE DRAWINGS

Common semiconductor devices useful in the practice of the present invention include metal oxide semiconductor and bipolar transistors, diodes, resistors, capacitors, and the like. Although illustrated in terms of a structure having both N-type and P-type regions on a single substrate, the method of the present invention has utility wherever N-type and P-type semiconductor regions must be formed in the same manufacturing environment or on the same piece of equipment, such as an epitaxial reactor or a molecular beam epitaxy system.

The band diagram shown in FIG. 1 illustrates a simple semiconductor structure having a substantially undoped N-type region 11 and a substantially undoped P-type region 14. The dashed vertical lines in FIG. 1 represent interfaces between the identified regions, and do not represent perturbances in the conduction band ($E_c$) or valence band ($E_v$). The term "substantially undoped" means that the region is substantially free of extrinsic doping atoms, but may still contain excess charge carriers provided by other portions of the device. For example, N-type region 11 is free of extrinsic doping atoms, but includes electrons donated by nearby doping regions 13 and 13'. Likewise, P-type region 14 is free of extrinsic doping atoms, but contains excess holes donated by doping regions 16 and 16'.

An important feature of the bipolar doping structure in accordance with the present invention is that doping regions 13 and 13' that provide electrons to N-type region 11 are substantially identical to doping regions 16 and 16' that provide holes to P-type region 14. In other words, a single type of dopant provides both excess holes and excess electrons, which then modulation dope nearby channels to a conductivity type determined not by the doping region, but instead by the material composition of the particular region that is to be doped.

N-type region 11 is separated from doping regions 13 and 13' by undoped spacer regions 12 which comprise a wide bandgap material. Spacer regions 12 are approximately three nanometers thick so that charge carriers in doping regions 13, 13', 16 and 16' can tunnel through the spacer regions to the nearby N-type region 11 and P-type region 14. Desirably, both doping regions 13, 13', 16, 16' and spacer regions 12 comprise the same wide bandgap material. In a preferred embodiment, doping regions 13, 13', 16, 16' and spacer regions 12 comprise aluminum antimonide (AlSb) or gallium aluminum antimonide (GaAlSb).

Doping regions 13, 13', 16, 16' comprise a material selected to have a doping energy level ($E_D$) that is less than the valence band maximum ($E_v$) of P-type region 14 and greater than the conduction band minimum ($E_c$) of N-type region 11, as illustrated by the horizontal dashed lines in FIG. 1. The doping energy level can be created either by extrinsic dopant or by native defects that produce the desire energy level. This requirement places other restrictions on the material choices. N-type region 11 must have a conduction band minimum less than the valence band maximum of P-type region 14. Suitable materials for N-type region 11 include indium arsenide (InAs) and for P-type region 14 include gallium antimonide (GaSb) when doping regions 13 and 16 comprise AlSb or AlGaSb.

Another important feature of the structure in accordance with the present invention is that the doping material in doping regions 13, 13', 16 and 16' should provide both holes and electrons. In a first example, the doping material comprises a single type of extrinsic atom selected to produce a deep energy level at $E_D$ as described above. Specifically, carbon, silicon, and germanium are expected to be acceptable kinds of atoms and provide the desired doping energy level. Also, Ga, Al, and In positioned on the Sb site in AlSb or GaSb are expected to have doping energies close to the desired $E_D$. These extrinsic dopants can be incorporated into doping regions 13, 13', 16 and 16' by ion implantation, or during epitaxial growth using well-known techniques. Because only one type of dopant is required for both N-type and P-type doping, bipolar processing is possible with half the equipment required to contain and process the chemical dopants, and with half the safety risk associated with the chemical dopant processes.

In another example, $E_D$ is provided by an anion site-antisite defect created during the growth of doping regions 13, 13', 16 and 16'. The anion site-antisite defect is a native defect in the GaAlSb material created by gallium or aluminum atoms positioned on the antimony site in the gallium-aluminum-antimonide system. The concentration of these defects is controlled by selection of epitaxial growth parameters such as III/V ratio, temperature, growth rate and the like. Other acceptable methods of controlling defect concentration are likely to be produced by ongoing research. Other defect types are acceptable doping materials when they provide an energy level above the conduction band minimum of N-type region 11 and below the valence band maximum of P-type region 14. In this second example, the materials and equipment traditionally required for extrinsic doping are entirely eliminated, greatly simplifying device manufacture and improving safety.

FIG. 2 illustrates a cross-section of a bipolar doped semiconductor structure in accordance with the present invention. Layers 11-14 and 16 are formed on a crystal substrate 10 which comprises, for example, semi-insulating gallium arsenide (GaAs). It should be understood that the upper surface of substrate 10 usually includes an epitaxially grown buffer layer to improve crystal perfection and compatibility with subsequent epitaxial processing. For ease of illustration and understanding, however, a buffer layer is not separately shown in FIG. 2.

The device shown in FIG. 2 includes N-type region 11 and P-type region 14 that are each covered above and below by spacer regions 12. Doping regions 13, 13', 16 and 16' are positioned adjacent to spacer regions 12. Because doping regions 13, 13', 16 and 16' are substantially identical, the locations of P-type region 14 and N-type region 16 can be interchanged. Doping regions 13 and 13' as well as 16 and 16' have dopant atoms with a doping energy level $E_D$, as described hereinbefore. The doping energy level $E_D$ is produced by a single kind of extrinsic doping atom, or a suitable native defect.

First or lowest doping region 13 is provided by depositing a first wide bandgap material covering substrate 10. Epitaxial deposition techniques such as molecular beam epitaxy (MBE), atomic layer epitaxy (ALE) and the like are acceptable means for accomplishing the deposition step. During the deposition, doping can be provided by introducing extrinsic dopant atoms during epitaxial growth, or by creating native defects during the epitaxial growth. A substantially undoped spacer layer 12 is formed covering first doping layer 13. N-type region 11 is formed covering spacer layer 12. N-type region 11 comprises a second material composition and in the example shown in FIG. 2 comprises InAs. Another substantially undoped spacer layer 12 is formed covering N-type region 11. A second doping region 13' can be used to provide more charge carriers to N-type region 11. Second doping region 13' comprises a similar composition and doping material as doping region 13, and functions in a similar manner.

An upper portion of the cross-section shown in FIG. 2 illustrates the formation of P-type region 14 using the same dopant material as used for N-type region 11. Second doping region 13' is covered by another doping region 16. Composition and doping material of doping region 16 is substantially the same as for doping regions 13 and 13'. Doping region 16 is covered by a spacer layer 12, which is in turn covered by P-type region 14. Because doping region 16 is nearby P-type region 14, it provides holes to the valence band of P-type region 14, and thus acts as a P-type dopant. P-type region 14 comprises a material such as GaSh in the preferred embodiment.

P-type region 14 is covered by another spacer layer 12, which serves to confine charge carriers in P-type regions 14. Another doping region 16' can be formed covering spacer 12 and separated from P-type region 14 by the thickness of spacer 12. Doping region 16' is similar in composition and function to doping regions 13, 13' and 16 discussed hereinbefore, and serves to provide additional charge carriers to P-type region 14.

Many layers of P-type region 14 and N-type regions 11 can be stacked vertically by simple repetition of the basic processes described above. Layers are laminated onto the structure, each layer patterned to form active devices or device elements. Each P-type region 14 and N-type region 11 is separated from adjacent layers by a wide bandgap spacer 12.

By now it should be appreciated that a semiconductor device having both N-type and P-type doping provided by a single dopant material is provided. Using modulation doping techniques, holes and electrons are provided to N-type and P-type regions while keeping doping atoms physically separated from the doped regions. Moreover, because only one dopant type is used, and the use of extrinsic dopant atoms can be eliminated, processing is greatly simplified and safety is improved.

We claim:

1. A bipolar doped semiconductor structure comprising:
a p-type quantum well including a first undoped channel layer having a first material composition sandwiched between two wide bandgap undoped spacer layers having a second material composition; an n-type quantum well including a second undoped channel layer having a third material composition sandwiched between two wide bandgap undoped spacer layers having the second material composition; and at least one doping region adjacent to one of the undoped spacer layers, wherein the doping region has the second material composition and has dopant atoms or native defects with a doping energy level, wherein the doping energy level is below a valence band maximum energy of the first undoped channel layer and above the conduction band minimum energy of the second undoped channel layer.

2. The bipolar doped semiconductor structure of claim 1 wherein the doping region further comprises a single species of extrinsic dopant atoms at a predetermined concentration, wherein the dopant atoms are selected to produce a deep energy level in the barriers and below a valence band maximum energy of the first undoped channel layer and above the conduction band minimum energy of the second undoped channel layer.

3. The bipolar doped semiconductor structure of claim 1 wherein the doping region further comprises anion site antisite defects which provide the excess holes and excess electrons.

4. The bipolar doped semiconductor structure of claim 3 wherein the second material composition is aluminum antimonide.

5. The bipolar doped semiconductor structure of claim 3 wherein the doping region is substantially free of extrinsic doping atoms.

6. The bipolar doped semiconductor structure of claim 1 wherein the first material composition is gallium antimonide, the second material composition is aluminum antimonide and the third material composition is indium arsenide.

7. A bipolar doped semiconductor structure comprising: a substrate; a first doping region substantially comprising a first material composition covering an upper surface of the substrate, wherein the first doping region includes holes and electrons in a doping energy level; a first undoped spacer region comprising the first material composition covering the doping region; a first undoped channel comprising a second material composition covering the first spacer region; and a second undoped spacer region comprising the first material composition, wherein the first material composition has a wider bandgap than the second material composition and the doping energy level is sufficient to provide electrons to the first undoped channel when the second material composition has a conduction band minimum energy less than the doping energy level and to provide holes to the first undoped channel when the second material composition has a valence band maximum energy greater than the doping energy level.

8. The bipolar doped semiconductor structure of claim 7 wherein the doping region further comprises a single species of extrinsic dopant atoms selected from the group consisting of carbon, silicon, and germanium.

9. The bipolar doped semiconductor structure of claim 7 wherein the excess holes and excess electrons are provided by anion site antisite defects located in the doping region.

10. The bipolar doped semiconductor structure of claim 9 wherein the first material composition is aluminum antimonide.

11. The bipolar doped semiconductor structure of claim 9 wherein the doping region is substantially free of extrinsic doping atoms.

12. The bipolar doped semiconductor structure of claim 10 wherein the second material composition is indium arsenide.

13. The bipolar doped semiconductor structure of claim 10 wherein the second material composition is gallium antimonide.

* * * * *